US008373512B2

(12) United States Patent
Sathe

(10) Patent No.: US 8,373,512 B2
(45) Date of Patent: Feb. 12, 2013

(54) OSCILLATOR DEVICE AND METHODS THEREOF

(75) Inventor: Visvesh S. Sathe, Fort Collins, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/976,014

(22) Filed: Dec. 22, 2010

(65) Prior Publication Data

US 2012/0161884 A1    Jun. 28, 2012

(51) Int. Cl.
*H03K 3/03* (2006.01)
(52) U.S. Cl. .............. 331/57; 331/45; 331/46; 327/156; 327/159
(58) Field of Classification Search .................... 331/57, 331/45, 46; 327/156, 159
See application file for complete search history.

(56) References Cited

U.S. PATENT DOCUMENTS 5,475,344 A * 12/1995 Maneatis et al. ................ 331/57
7,236,060 B2 * 6/2007 Wood .............................. 331/57

* cited by examiner

*Primary Examiner* — Arnold Kinkead

(57) ABSTRACT

A signal generator provides a plurality of oscillating signals, whereby each oscillating signal has a different peak voltage and has a predictable and consistent phase relationship with the other oscillating signals. The signal generator includes a plurality of stacked oscillators arranged between two reference voltages, such that each oscillator in the stack generates an oscillating signal having a different peak voltage. Each oscillator stage in a designated oscillator includes a transistor that is connected to a transistor of a corresponding stage in another oscillator. This arrangement of the oscillators provides for charge transfer between the corresponding stages to provide for similar voltage swings in each oscillating signal, as well as to provide for predictable phase relationship between the oscillating signals.

19 Claims, 6 Drawing Sheets

OSCILLATOR DEVICE AND METHODS THEREOF

BACKGROUND

1. Field of the Disclosure

The present disclosure generally relates to oscillators, and more particularly to oscillators for providing multiple oscillating signals.

2. Description of the Related Art

Data processing devices sometimes employ oscillator devices in conjunction with a voltage converter to convert a voltage. In particular, the voltage converter typically uses multiple switch capacitor modules to convert a supplied voltage, whereby the oscillator generates clock signals that control switching of the switch capacitor modules. However, depending on the arrangement of the voltage converter, different ones of the switch capacitor modules can require different voltages to change the states of the associated switches. Accordingly, in some devices, the oscillator generates each clock signal having a peak voltage equal to the highest voltage required to actuate any of the switches. However, this approach can consume an undesirably large amount of power. In other devices, the clock signals are passed through voltage converters so that the peak voltage for each clock signal is set to the appropriate level for the associated switch. However, the voltage converters can be inefficient and consume an undesirable amount of circuit area.

In still other devices a latch-based drive scheme is employed to modify the clock signal for each switch. In particular, intermediate voltage levels available in a voltage converter serve as supply rails that drive partially-cross coupled inverters. Transitions in the lowest voltage range travel up the "rungs" of the converter topology to change the state of each latch, thereby turning on/off the desired switches. However, the latch-based drive scheme is typically not suitable for converters that need to drive current loads characteristic of data processing devices due to the large crowbar current that results in flipping the latch configuration.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

FIGS. 1-6 illustrate devices and techniques for providing a plurality of oscillating signals, whereby each oscillating signal has a different peak voltage and has a predictable and consistent phase relationship with the other oscillating signals. In particular, a signal generator disclosed herein includes a plurality of stacked oscillators arranged between two reference voltages, such that each oscillator in the stack generates an oscillating signal having a different peak voltage. Each oscillator includes a number of stages that generate intermediate signals upon which the oscillator output signal is based. Further, each stage in a designated oscillator includes a transistor that is connected to a transistor of a corresponding stage in another oscillator. In an embodiment, this arrangement of the oscillator stages provides for charge transfer between nodes of identical or similar capacitance in the corresponding stages of another oscillator to provide for equal voltage swings in each oscillating signal, as well as to provide for the predictable phase relationship between the oscillating signals.

Figure 1:
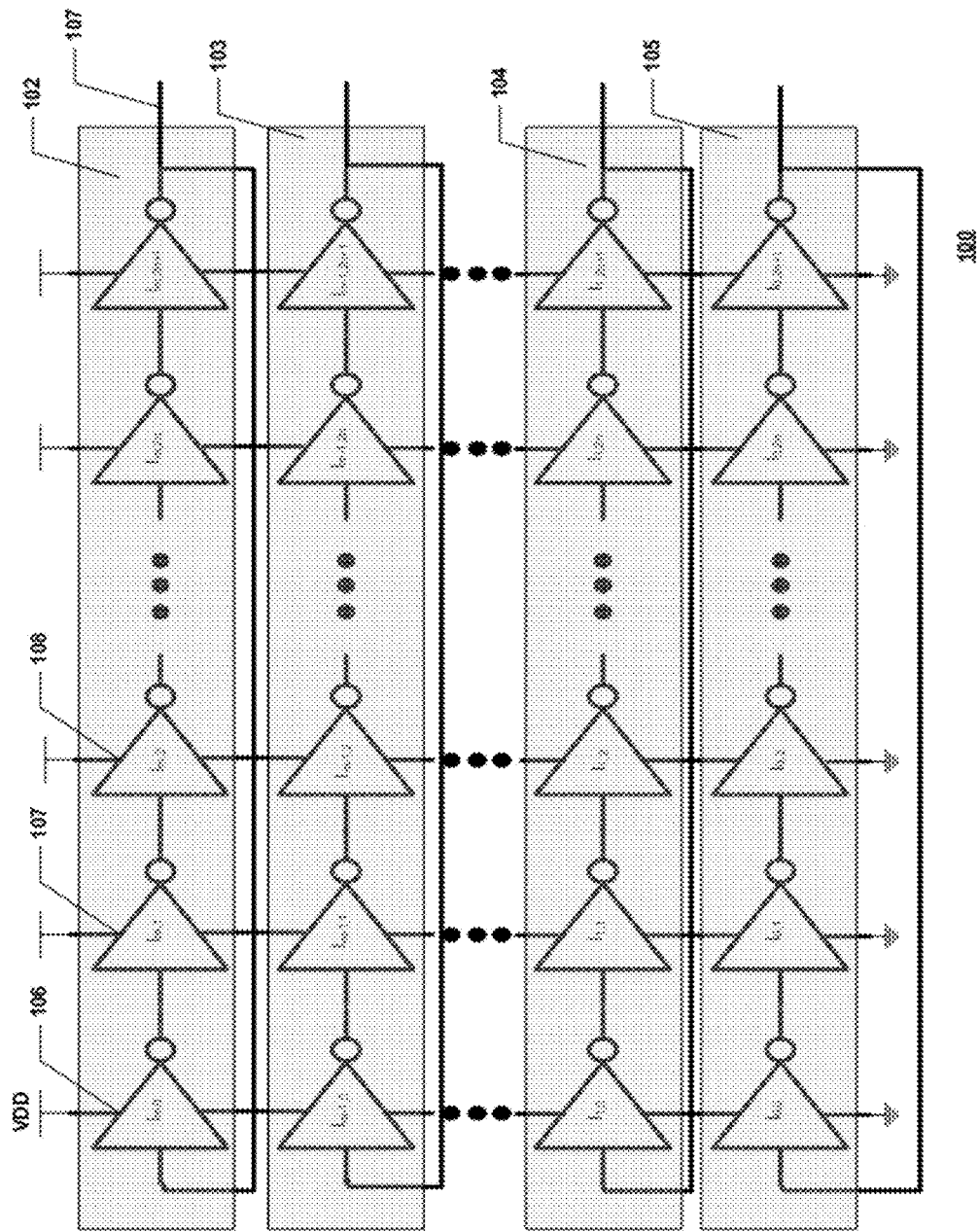
FIG. 1 is block diagram illustrating a signal generator in accordance with a specific embodiment of the present disclosure.

FIG. 1 illustrates a block diagram of a signal generator 100 in accordance with one embodiment of the present disclosure. The signal generator 100 includes a plurality of oscillators, including oscillators 102, 103, 104, and Nth oscillator 105, where N is an integer. Each of the oscillators 102-105 includes a plurality of oscillator stages. As used herein, an oscillator stage is defined as a portion of an oscillator that provides an inverted representation of an input signal received by the oscillator stage. In the illustrated embodiment, each of the oscillator stages is an inverter logic gate. In other embodiments, each stage can include additional or different logic elements and other circuit elements, or a combination thereof. As used herein, peak voltage of an oscillating signal refers to the highest voltage reached by the oscillating signal relative to a fixed voltage reference, such as a ground voltage reference, of the overall signal generator circuit. The voltage swing of an oscillating signal refers to the difference between the peak voltage for the oscillating signal and the lowest voltage reached by the oscillating signal relative to the fixed voltage reference.

Each of the oscillators 102-105 includes an output (e.g., output 107 for oscillator 102) to provide an oscillating signal. Each of the oscillators 102-105 further includes M number of stages, where M is an odd-numbered integer. The output of the Mth stage of a particular oscillator is connected to the input of the first stage of the oscillator, resulting in an oscillating signal at each oscillator output.

In the illustrated embodiment, each stage of the oscillators 102-105 is connected to at least one corresponding stage of another oscillator. This arrangement provides for charge sharing between nodes of the oscillator stages, such that the output signal for a particular oscillator has a different peak voltage than the output signals of the other oscillators. This arrangement also provides for similar voltage swings in the output signals of the oscillators, and maintains a predictable and consistent phase relationship between the output signals.

To illustrate, oscillator 102 includes a plurality of stages, including stages 106, 107, and 108. Each of the stages 106-108 is an inverter that includes a p-type metal oxide semiconductor (PMOS) source terminal and an n-type metal oxide semiconductor (NMOS) source terminal. The PMOS source terminals of the stages of oscillator 102 are each connected to a power supply reference voltage, labeled VDD. Oscillator 103 includes the same number of stages as oscillator 102, where each stage is an inverter that includes a PMOS source terminal and an NMOS source terminal. The PMOS source terminals of the stages of oscillator 103 are each connected to the NMOS source terminal of the corresponding stage of the oscillator 102. The other oscillators of the signal generator 100 are similarly stacked, such that the PMOS source terminals of an oscillator stage are connected to the NMOS source terminal of the corresponding stage that is next-higher in the stack. For Nth oscillator 105, corresponding to the last or bottom oscillator of the stack, the NMOS source terminals are connected to a ground voltage reference.

In operation, as the input signal to a designated oscillator stage changes state, charge is transferred from the corresponding stage of the next-higher oscillator in the stack to a node of the designated oscillator stage. A subsequent change of state in the input signal results in a portion of the charge being passed to the corresponding stage of the next-lower oscillator in the stack. As a result of the charge transfer between the stacked oscillators, the state of the stage output signal changes, resulting in an oscillation of the stage output signal.

Figure 2:
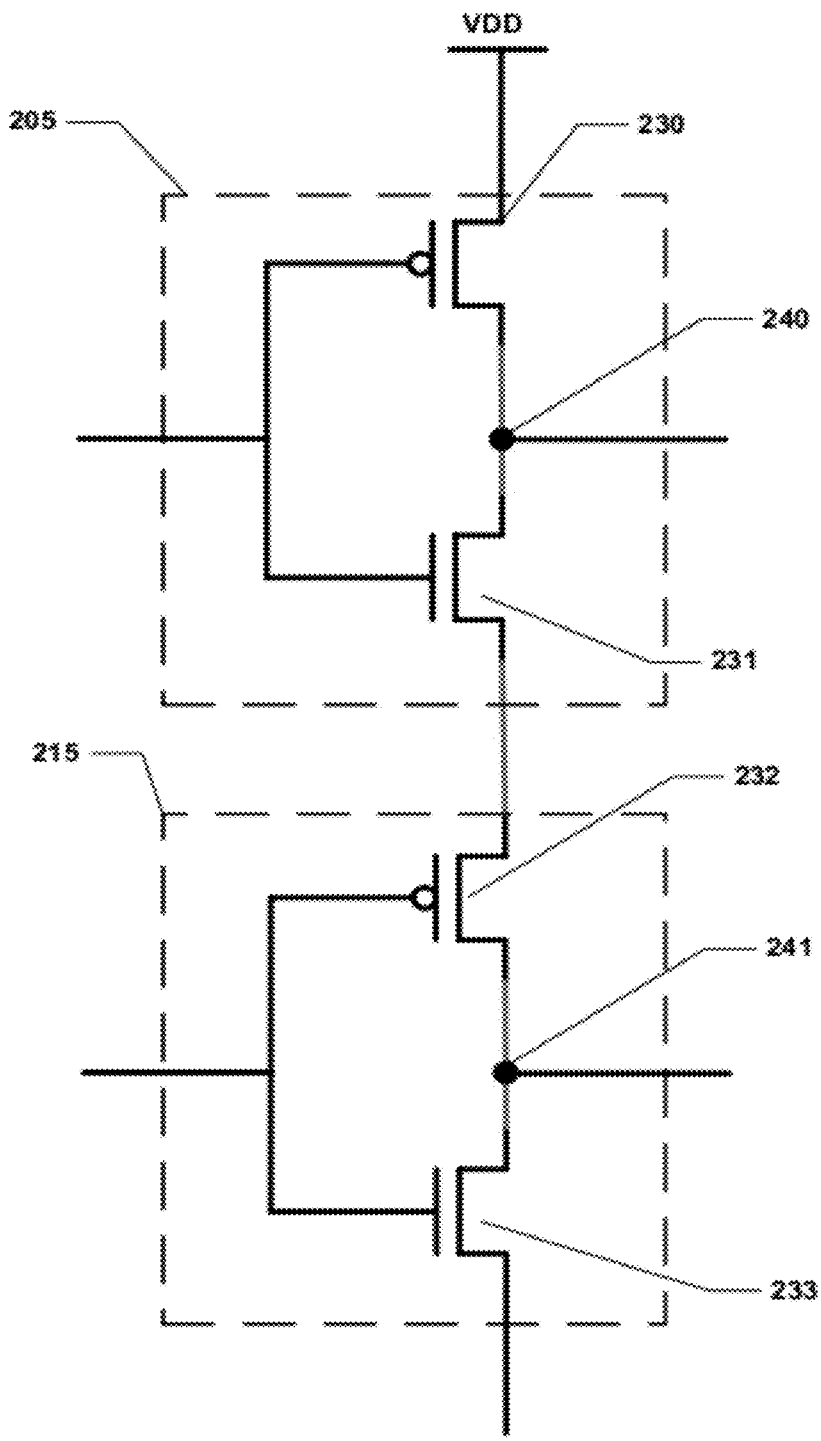
FIG. 2 is a circuit diagram of a stage of the oscillator of FIG. 1 in accordance with one embodiment of the present disclosure.

Operation of the oscillator stages of FIG. 1 can be better understood with reference to FIG. 2, which illustrates a circuit diagram of two stages of the oscillator 100, whereby each of the illustrated stages is associated with a different oscillator. In particular, FIG. 2 illustrates a stage 205, associated with oscillator 102, and a stage 215, associated with oscillator 103. The stage 205 includes a p-type transistor 230 and an n-type transistor 231, while the stage 215 includes a p-type transistor 232 and an n-type transistor 233. The transistor 230 includes a source current electrode connected to the VDD reference voltage, a drain current electrode, and a control electrode connected to the input of the stage 205. The transistor 231 includes a drain current electrode connected to the drain current electrode of the transistor 230, a source current electrode, and a control electrode connected to the input of the stage 205. The transistor 232 includes a source current electrode connected to the source current electrode of the transistor 231, a drain current electrode, and a control electrode connected to the input of the stage 215. The transistor 233 includes a drain current electrode connected to the drain current electrode of the transistor 232, a source current electrode, and a control electrode connected to the input of the stage 215. The source current electrode of the transistor 233 is connected to the source current electrode of the PMOS transistor of the corresponding stage for the next-lower oscillator (not shown) of the signal generator 100. The source current electrode of the NMOS transistor for the corresponding stage in the lowest oscillator of the signal generator 100 is connected to a ground voltage reference.

In operation, in response to the input signal for stage 205 reaching a negated state, charge is transferred from the VDD reference voltage, through the current electrodes of the transistor 230, to node 240. In response to the input signal for stage 205 reaching an asserted state, and the input signal for stage 215 reaching a negated state, a portion of the charge at node 240 is transferred to node 241 of stage 215. In response to the input signal for stage 205 reaching an asserted state, and the input signal for the next-lower stage reaching a negated state, a portion of the charge at node 241 is transferred with a corresponding node of the next lower stage.

Figure 3:
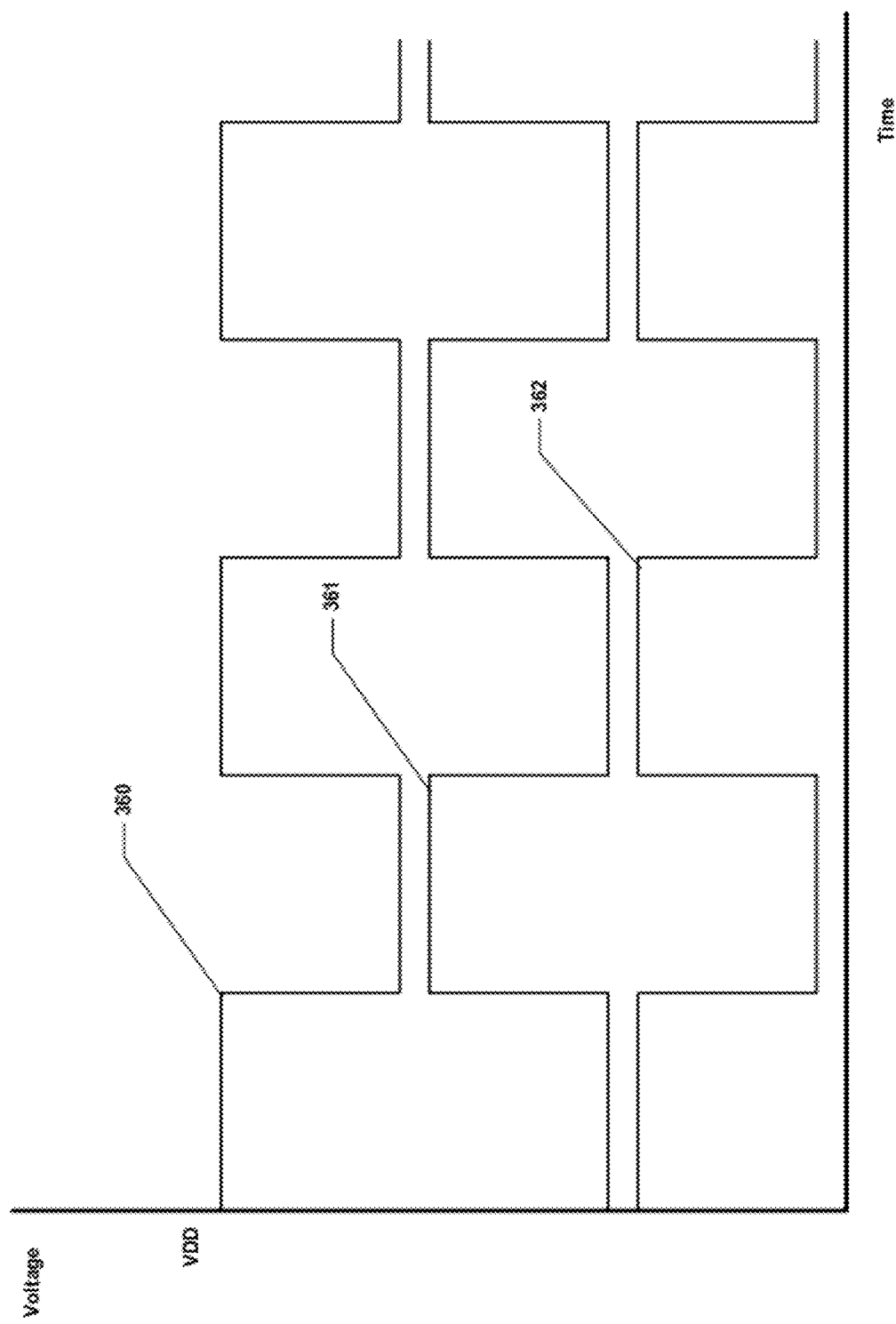
FIG. 3 is a diagram illustrating selected output signals of the oscillator of FIG. 1 in accordance with one embodiment of the present disclosure.

In similar fashion, charge is transferred between the nodes of each corresponding stage and finally to the ground voltage reference. Further, the charge transfer between nodes establishes an oscillating signal at each node. The relative peak voltage for each oscillating signal will differ, decreasing for each oscillator in the stack. This is illustrated in FIG. 3, which shows signal waveforms for the oscillator 100 in accordance with one embodiment of the present disclosure. In particular, FIG. 3 illustrates waveforms 360, 361, and 362, corresponding to the output signals for three successive oscillators in the stack of oscillator 100. As illustrated, each of the output signals has a similar voltage swing, but different peak voltages. Further, as illustrated, the charge sharing between nodes of the oscillators provides for a predictable and regular phase relationship between the output signals. Thus, in the illustrated example, waveform 361 indicates that the corresponding signal is substantially 180 degrees out of phase with the signal corresponding to waveform 362.

Figure 4:
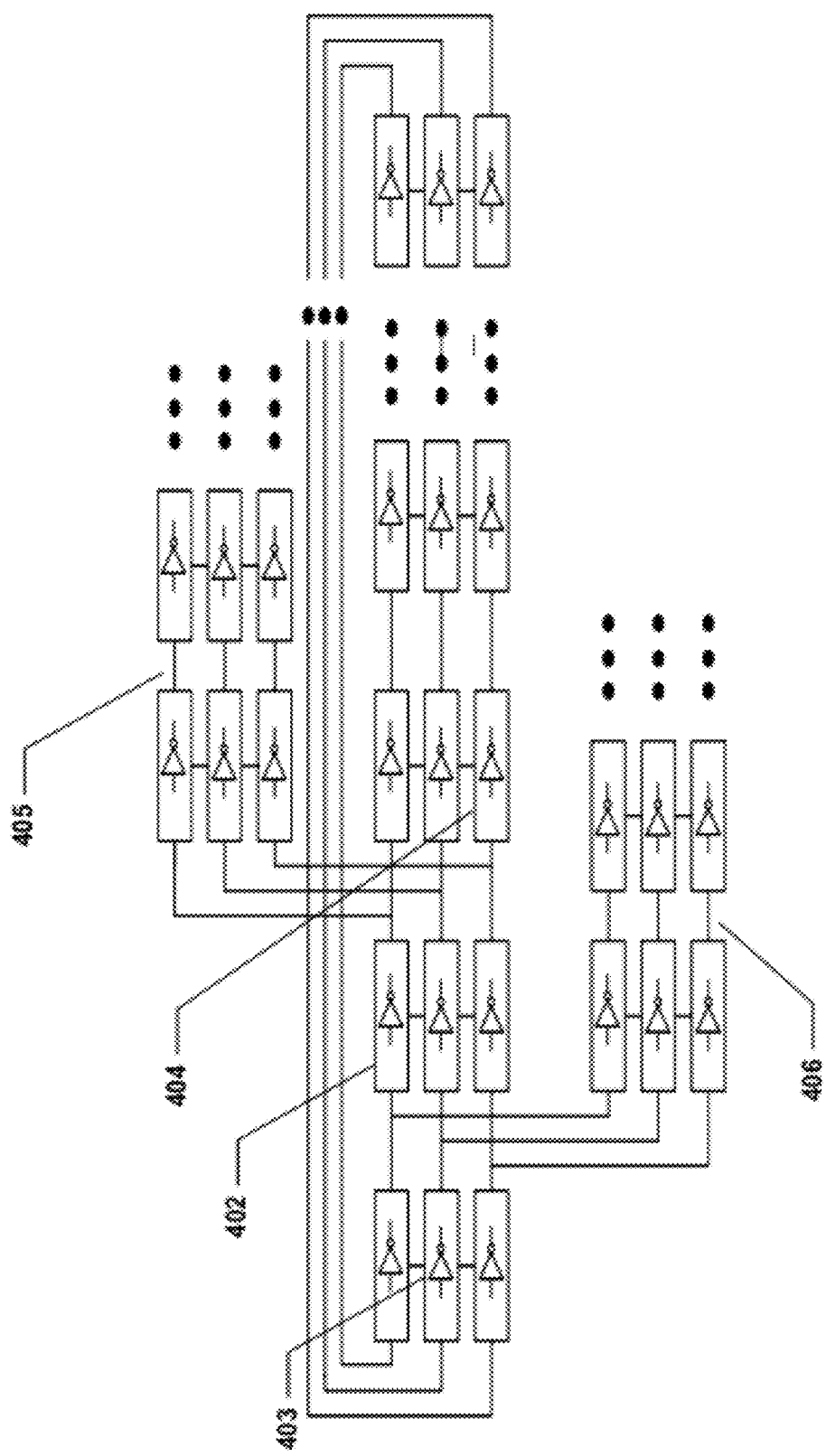
FIG. 4 is a block diagram illustrating an oscillator in accordance with another embodiment of the present disclosure.

FIG. 4 illustrates a signal generator 400 in accordance with another embodiment of the present disclosure. The signal generator 400 includes three oscillators, designated oscillators 402, 403, and 404, arranged in a stack similar to oscillator 100 of FIG. 1. Further, each of the oscillators 402-404 is connected to two corresponding sets of gain stages. Accordingly, a first node of the oscillator 402 is connected to set 405 of gain stages, while a second node of the oscillator 402 is connected to a set 406 of gain stages. The sets 405 and 406 of gain stages are employed to provide additional current to allow the corresponding oscillator to drive one or more switches. In the illustrated embodiment, each gain stage in a set of gain stages is an inverter device. Each oscillator is connected to two different sets of gain stages at two complementary nodes to allow for control of complementary switches with the same oscillating signal. Moreover, the gain stages are arranged in stacks similar to the arrangement of the oscillators 402-404, to preserve the relative differences in peak voltage and the predictable phase relationship between the oscillating signals.

Figure 5:
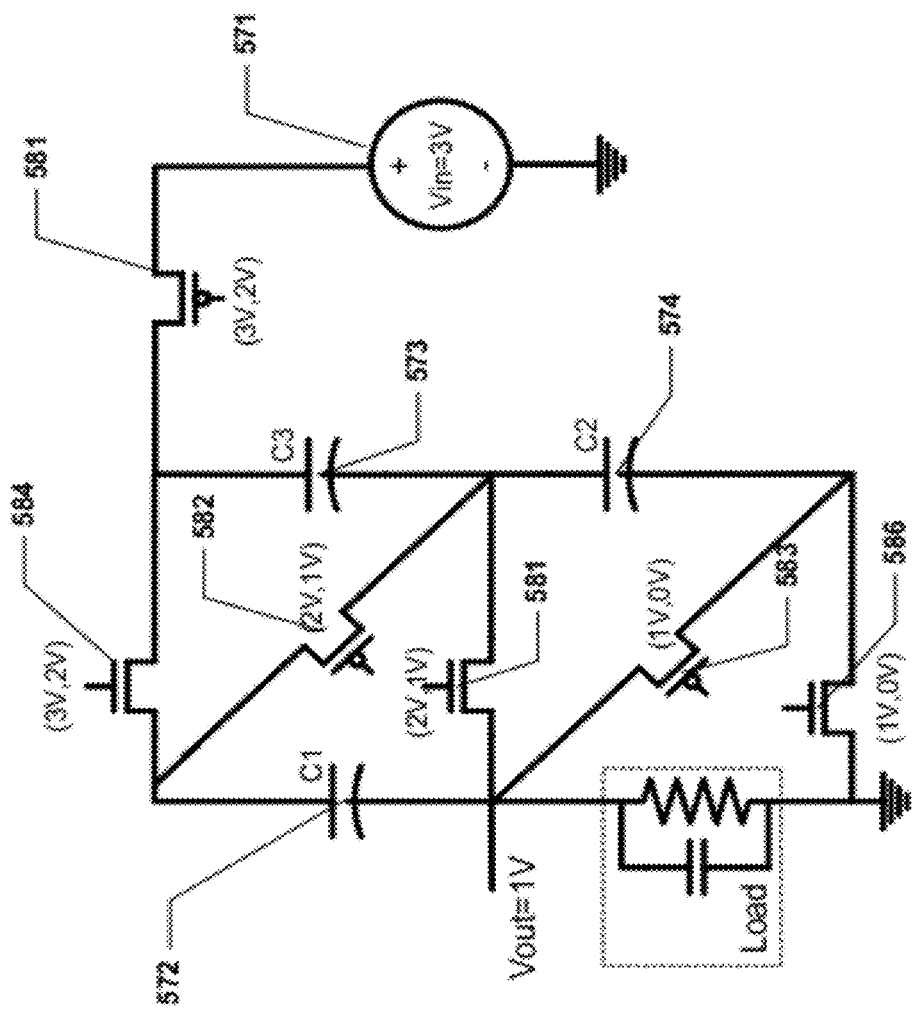
FIG. 5 is a circuit diagram of a voltage converter in accordance with one embodiment of the present disclosure.

FIG. 5 illustrates a voltage converter 500 that can be controlled by the oscillator 400 in accordance with one embodiment of the present disclosure. The voltage converter 500 includes a voltage source 571, capacitors 572, 573, and 574, a load 575, p-channel transistors 581, 582, and 583, and n-channel transistors 584, 585, and 586. Voltage source 571 includes a first terminal connected to a ground voltage reference and a second terminal. Transistor 581 includes a first current electrode connected to the second terminal of the voltage reference, a second current electrode, and a control electrode. Transistor 584 includes a first current electrode connected to the second current electrode of the transistor 581, a second current electrode, and a control electrode. Transistor 582 includes a first current electrode connected to the second current electrode of the transistor 584, a second current electrode, and a control electrode. Transistor 585 includes a first current electrode connected to the second current electrode of the transistor 582, a second current electrode, and a control electrode. Transistor 583 includes a first current electrode connected to the second current electrode of the transistor 585, a second current electrode, and a control electrode. Transistor 586 includes a first current electrode connected to the second current electrode of the transistor 583, a second current electrode connected to the ground voltage reference, and a control electrode.

Capacitor 572 includes a first terminal connected to the second current electrode of the transistor 584 and a second terminal connected to the second current electrode of the transistor 585. Capacitor 573 includes a first terminal connected to the second current electrode of the transistor 581 and a second terminal connected to the second current electrode of the transistor 582. Capacitor 574 includes a first terminal connected to the second electrode of the capacitor 573 and a second terminal connected to the second current electrode of the transistor 583. The load 575 includes a first terminal connected to the second terminal of the capacitor 572 and a second terminal connected to the ground voltage reference.

In the illustrated embodiment, the transistors 581-586 are arranged as switches, whereby control signals at the respective control electrodes of the transistors 581-586 control the state of the respective switch. The state of the switches determines whether each of the capacitors 572-574 is charging or discharging. By controlling the charging and discharging periods for each of the capacitors 572-574 in a specified manner, the voltage provided by voltage source 571 is converted to a lower voltage that is provided to the load 575.

In order to convert the voltage provided by voltage source 571, oscillating signals can be provided to each of the capacitors 581-586. However, because of the different positions of the transistors 581-586, the voltages that will change the state of each switch varies. Thus, for example, in the embodiment of FIG. 5 transistor 585 requires a signal level of 2 volts to set the transistor to a conductive state and a signal level of 1 volt to set the transistor to a non-conductive state. Transistor 581 requires a signal level of 3 volts to set the transistor to a conductive state and a signal level of 2 volts to set the transistor to a non-conductive state. Further, in order to achieve efficient voltage conversion it is desirable that the periods of charging and discharging the capacitors 572-574 have a predictable and regular phase relationship. Accordingly, signal generator 400 can be employed to provide the control signals for the voltage converter 500. In particular, each of the transistors 581-586 can be connected to the output signal of the signal generator 400 having a peak voltage and voltage swing that can change the state of the respective transistor. The signal generator 400 thereby provides for efficient control of the voltage converter 500.

Figure 6:
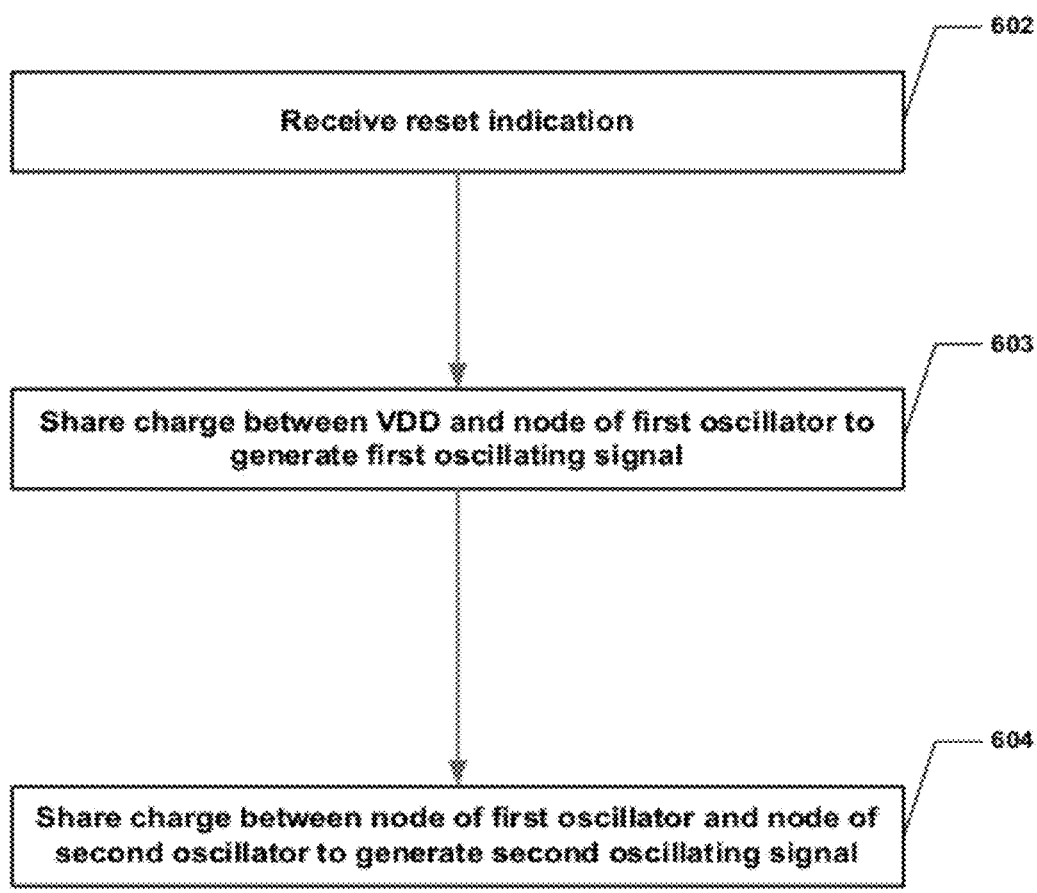
FIG. 6 is a flow diagram of a method of providing a plurality of oscillating signals with the oscillator of FIG. 1 in accordance with one embodiment of the present disclosure.

FIG. 6 illustrates a flow diagram of a method of operating the signal generator 100 of FIG. 1 in accordance with one embodiment of the present disclosure. At block 602, a reset indication is received at a data processing device associated with the oscillator 100. At block 603, charge is shared between a voltage reference and a node of oscillator 102, thereby generating an oscillating signal at the output of the oscillator. At block 604, in response to a change in state of an input signal at a corresponding stage of oscillator 103, charge is shared between the node of oscillator 102 and a corresponding node of oscillator 103. This generates an oscillating signal at the output of oscillator 103.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
generating a first oscillating signal at an output of a first oscillator the first oscillating signal having a first peak voltage; and
transferring, via a conductor, charge between a first node of the first oscillator and a first node of a second oscillator to generate a second oscillating signal at an output of the second oscillator, the second oscillating signal having a second peak voltage different from the first.

2. The method of claim 1, further comprising transferring charge between a second node of the first oscillator and a second node of the second oscillator to generate the second oscillating signal.

3. The method of claim 1, further comprising controlling operation of a voltage converter based on the first oscillating signal and the second oscillating signal.

4. The method of claim 3, wherein controlling operation of the voltage converter comprises controlling operation of a plurality of switch capacitor modules based on the first oscillating signal and the second oscillating signal.

5. A device, comprising:
a first oscillator comprising:
a first output to provide a first oscillating signal; and
a first plurality of stages coupled to the first output, the first plurality of stages comprising a first stage including a first transistor; and
a second oscillator comprising:
a second output to provide a second oscillating signal; and
a second plurality of stages coupled to the second output, the second plurality of stages comprising a second stage including a second transistor having a first current electrode coupled to a first current electrode of the first transistor.

6. The device of claim 5, wherein:
the first plurality of stages further comprises a third stage comprising a third transistor; and
the second plurality of stages further comprises a fourth stage comprising a fourth transistor having a current electrode coupled to a current electrode of the third transistor.

7. The device of claim 5, wherein the first output is to provide the first oscillating signal having a first peak voltage and the second output is to provide the second oscillating signal having a second peak voltage, the second peak voltage different from the first peak voltage.

8. The device of claim 7, wherein the first output is to provide the first oscillating signal having substantially the same voltage swing as the second oscillating signal.

9. The device of claim 5, wherein the first stage comprises a first inverter and the second stage comprises a second inverter.

10. The device of claim 9, wherein:
the first stage comprises a third transistor having a current electrode coupled to a second current electrode of the first transistor, the second current electrode of the first transistor to provide the first oscillating signal; and
the second stage comprises a fourth transistor having a current electrode coupled to a second current electrode of the second transistor, the second current electrode of the second transistor to provide the second oscillating signal.

11. The device of claim 5, wherein the first output is to provide the first oscillating signal substantially 180 degrees out of phase with the second oscillating signal.

12. The device of claim 5, further comprising:
a first switch capacitor module coupled to the output of the first oscillator.

13. The device of claim 12, further comprising:
a second switch capacitor module coupled to the output of the second oscillator.

14. The device of claim 5, further comprising:
a first plurality of gain stages coupled to the output of the first oscillator.

15. The device of claim 14, further comprising:
a second plurality of gain stages coupled to the output of the second oscillator.

16. A device, comprising:
a first oscillator comprising:
 an output to provide a first oscillating signal having a first peak voltage; and
 a first node, the first oscillating signal based on charge at the first node; and
a second oscillator comprising:
 an output to provide a second oscillating signal having a second peak voltage different from the first peak voltage; and
 a second node coupled to the first node via a conductor, the first node to transfer charge to the second node via the conductor based on the first oscillating signal, the second oscillating signal based on charge at the second node.

17. The device of claim 14, further comprising:
a third oscillator comprising:
 an output to provide a third oscillating signal; and
 a third node coupled to the second node, the second node to transfer charge to the third node based on the second oscillating signal, the third oscillating signal based on charge at the third node.

18. The device of claim 16, wherein the first oscillating signal is associated with substantially the same voltage swing as the second oscillating signal.

19. The device of claim 16, wherein:
the first oscillator further comprises a third node, the first oscillating signal based on charge at the third node; and
the second oscillator further comprises a fourth node coupled to the third node, the third node transferring charge to the fourth node based on the first oscillating signal, the second oscillating signal based on charge at the fourth node.

\* \* \* \* \*